United States Patent [19]

Wheatley, Jr.

[11] 4,057,763

[45] Nov. 8, 1977

[54] CURRENT AMPLIFIERS

[75] Inventor: Carl Franklin Wheatley, Jr., Somerset, N.J.

[73] Assignee: RCA Corporation, New York, N.Y.

[21] Appl. No.: 687,214

[22] Filed: May 17, 1976

[51] Int. Cl.[2] .......... H03F 3/04

[52] U.S. Cl. .......... 330/288; 323/4; 330/299; 330/291; 330/307; 357/35; 357/43

[58] Field of Search .......... 307/297; 323/4; 330/17, 330/19, 22, 35, 40, 25, 26, 38 M, 357

[56] References Cited

U.S. PATENT DOCUMENTS

| | | | |
|---|---|---|---|
| 3,588,672 | 6/1971 | Wilson | 323/4 |
| 3,952,257 | 4/1976 | Schade, Jr. | 330/22 |
| 3,973,215 | 8/1976 | Ahmed | 330/22 X |

FOREIGN PATENT DOCUMENTS

| | | | |
|---|---|---|---|
| 1,141,338 | 12/1962 | Germany | 330/22 X |

*Primary Examiner*—Rudolph V. Rolinec

*Assistant Examiner*—Lawrence J. Dahl

*Attorney, Agent, or Firm*—H. Christoffersen; S. Cohen; A. L. Limberg

[57] ABSTRACT

Current mirror amplifiers, which exhibit greater current attenuation (or gain) than prior art current mirror amplifiers taking up the same area on a monolithic integrated circuit die, are described in which the base-emitter junctions of the mirroring transistors are dissimilar in profile.

69 Claims, 24 Drawing Figures

Figure 9:
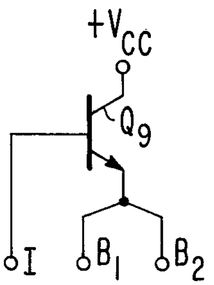

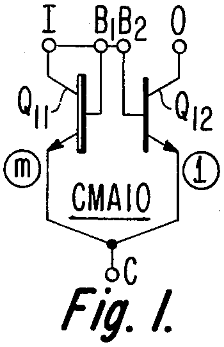
Fig. 1.
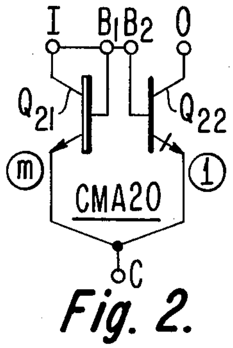
Fig. 2.
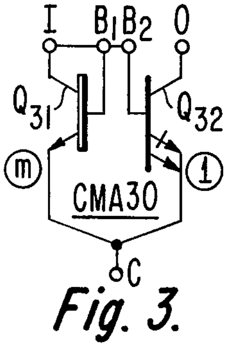
Fig. 3.
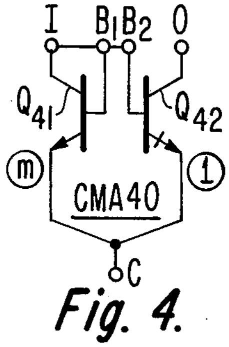
Fig. 4.
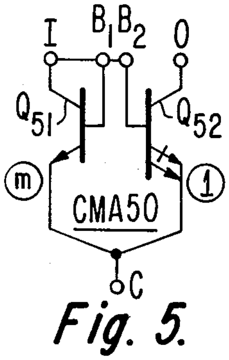
Fig. 5.
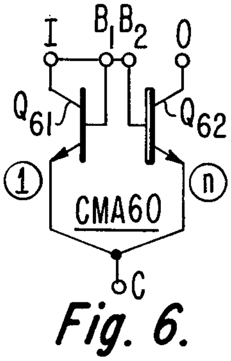
Fig. 6.
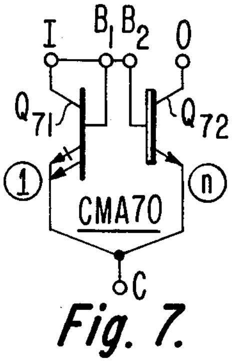
Fig. 7.
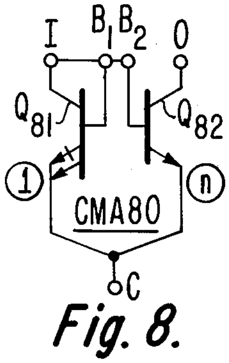
Fig. 8.
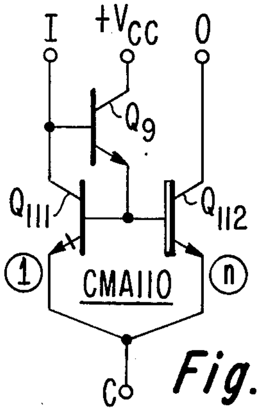
Fig. 11.
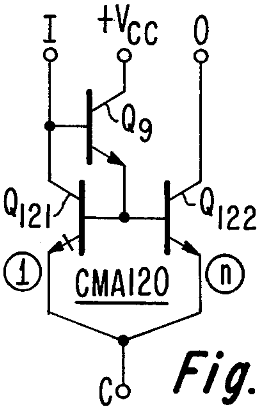
Fig. 12.
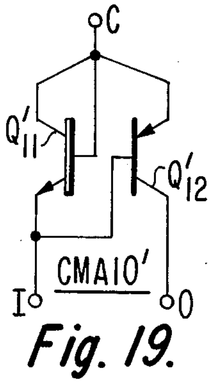
Fig. 19.
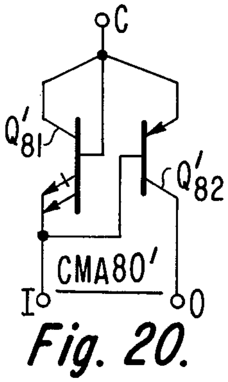
Fig. 20.
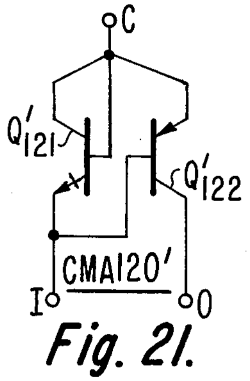
Fig. 21.
LEGEND
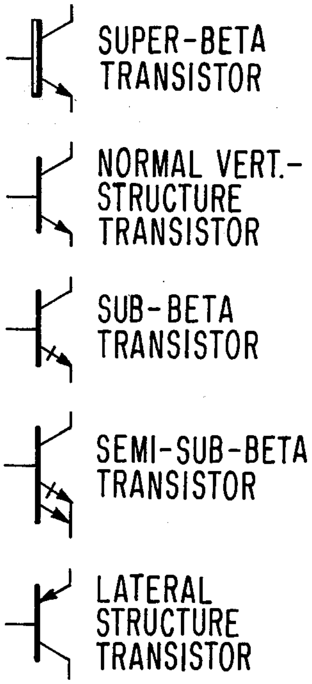

CURRENT AMPLIFIERS

The present invention concerns current amplifiers such as those suitable for construction in monolithic integrated-circuit form.

Prior art current mirror amplifiers (CMA's) each include a pair of mirroring transistors formed concurrently in the same basic semiconductor material by the same processing steps and so provided with respective base-emitter junctions having similar doping profiles. These mirroring transistors have their respective collector electrodes connected to the input and output terminals, respectively, of the CMA and have their emitter electrodes connected to its common terminal. The "master" mirroring transistor, having its collector-to-emitter path in the input circuit of the current mirror amplifier, is provided with direct coupled collector-to-base feedback to adjust its base-emitter potential to condition the transistor for conducting input current applied between the input and common terminals. This same base-emitter potential is applied to the "slave" mirroring transistor, which has its collector-to-emitter path in the output circuit of the CMA, conditioning it to respond to the input current with an output current. The current gain between input and output terminals is substantially equal to the transconductance of the "slave" mirroring transistor divided by the transconductance of the "master" mirroring transistor, and the transconductances are proportionally related to their respective effective base-emitter junction areas.

Sheng in United States Defensive Publication T934,009 published May 6, 1975 and entitled "Composite Transistor" describes a CMA using a lateral structure PNP slave-mirroring transistor and a self-biased vertical-structure NPN master mirroring transistor together. This CMA has a current gain close to unity for minimum size transistors, and is used to save a substantial portion of the area that would be taken up in a monolithic die were the master mirroring transistor also a lateral-structure PNP.

CMA's which do not exhibit high current gain or high current attenuation are realizable in a fairly compact area on a monolithic die. However, a continuing concern has been to find circuits exhibiting high current gain and circuits exhibiting high current attenuation that are reasonably economical of area in a monolithic die. In United States Pat. Nos. 3,320,439, 3,659,121, 3,829,789, 3,831,040 and 3,921,013 various solutions for fixed-inputcurrent circuits are described, each of which require the use of resistors. Resistors tend to take up excessive area on a monolithic die, particularly if they do not have certain favored resistance values. In U.S. Pat. No. 3,611,171, 3,846,696 and 3,868,581, CMA's providing constant high current attenuation are described, but all tend to take up substantially more area on the monolithic die than a CMA with a current gain of minus unity. The present inventor believed that a better solution to the current scaling problem might exist in which the mirroring transistors in the CMA had differing base-emitter junction profiles.

It is known that the four types of transistors listed below have different common-emitter forward current gains--i.e., betas or $h_{fe}$'s.

a. the conventional-process vertical-structure (or CPVS) transistor;

b. the vertical-structure transistor modified in that the emitter doping is driven in to greater depth resulting in the thin, more lightly doped base region characterizing the "super-beta" or "punch-through" transistor;

c. the vertical-structure transistor modified in that the doping in the base region is made relatively high, resulting in a "sub-beta" transistor; and d. the vertical structure transistor modified in that the doping of only a portion of the base region adjoining only a portion of the emitter region is relatively highly doped, resulting in a "semi-sub-beta transistor". (The semi-sub-beta type of transistor appears similar to a transistor type suggested by Berger and Wiedmann in the *IBM Technical Disclosure Bulletin,* Vol. 15, No. 5, dated October 1972 and entitled "Integrated Transistor with Variable Current Amplification".)

The super-beta types have an $h_{fe}$ about twenty times larger than that of the CPVS transistor; the sub-beta transistors have an $h_{fe}$ about sixty times smaller than that of the CPVS transistor; semi-sub-beta transistors have $h_{fe}$'s between those of CPVS and sub-beta transistors.

The present inventor has determined that there is surprisingly good tracking between the betas of the super-beta, CPVS, and sub-beta types--i.e., the ratios between their $h_{fe}$'s are maintained quite well over the course of manufacture, all departing from design norms by about the same percentage factor on any given monolithic die. The $h_{fe}$ of a semi-sub-beta transistor is due in largest part to that portion of its base-emitter junction resembling the junction of a CPVS transistor, and so the $h_{fe}$'s of semi-sub-beta transistors can be made to track the $h_{fe}$'s of CPVS transistors particularly well. He has also determined that these transistors, when fabricated on the same monolithic die, have substantially the same base current demands at any given base-emitter potential.

The similar-valued base currents for a pair of similar-area transistors of dissimilar types chosen from super-beta, CPVS, sub-beta, and semi-sub-beta types, together with the different $h_{fe}$ characteristics provide a marked difference in the densities of current flow across the base-emitter junctions of the pair for any given base-emitter potential. The present inventor, having found the described base current, base-emitter potential characteristics and the described beta tracking characteristics recognized that using the listed types of transistors with dissimilar base-emitter junction profiles as the mirroring transistors in a CMA would provide a powerful new way of determining the ratio between the input and output currents of the CMA. This new way can replace the conventional way of determining the ratio of CMA input and output currents by the ratio of their relative effective areas of the base-emitter junctions of the master and slave mirroring transistors, thereby reducing the area required on a monolithic integrated circuit die for CMA's having current gains that have amplitudes differing from unity. Also, however, the two ways of current scaling may be used together, in concert, to obtain CMA's having current gains with amplitudes substantially different from unity in reduced area in a monolithic integrated circuit die.

The present invention is embodied in current mirror amplifier configurations which have a pair of mirroring transistors of different types as chosen from the super-beta, CPVS, sub-beta and semi-sub-beta transistor types. The mirroring transistors are fabricated together in a monolithic integrated circuit die so they share the same operating temperature.

Figure 10:
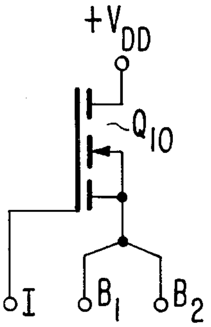
Figure 13:
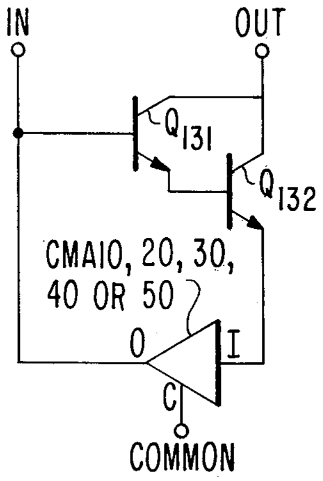
Figure 14:
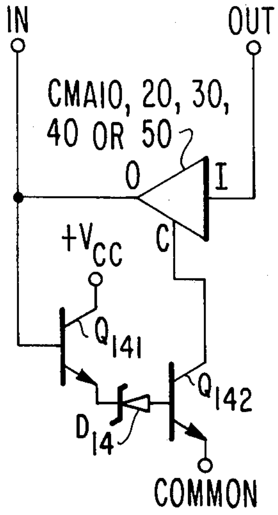
Figure 22:
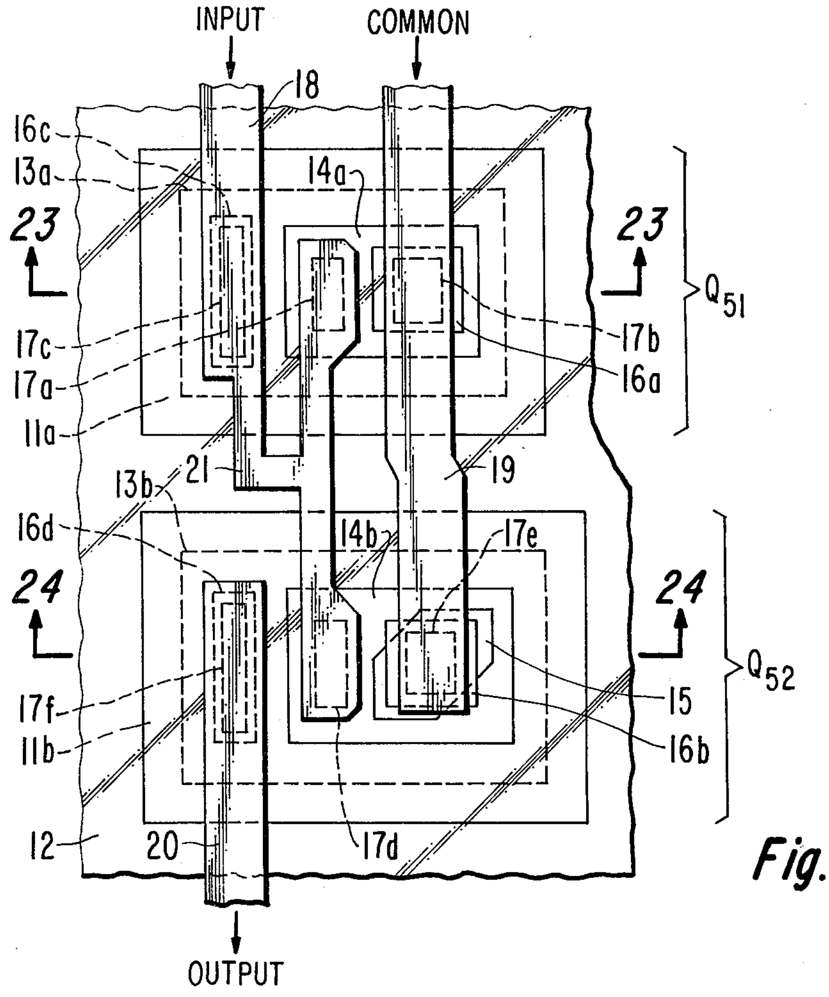
Figure 23:
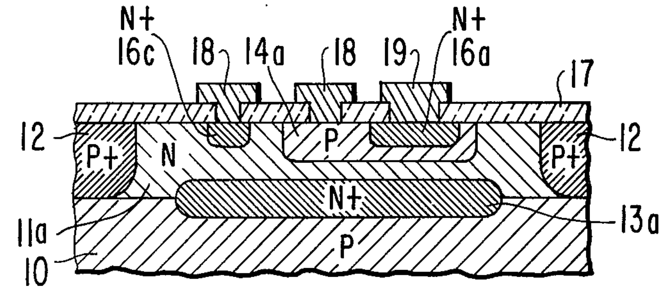
Figure 24:
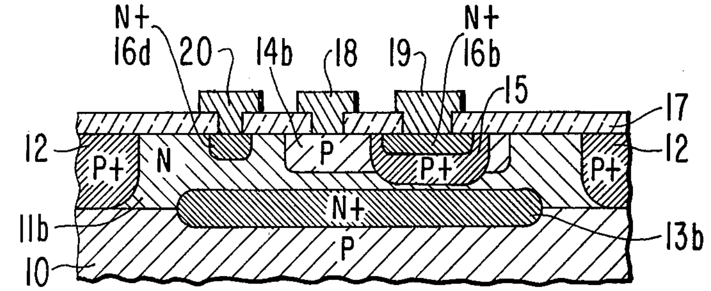

Each of FIGS. 1-8 is a schematic diagram showing the simple current mirror amplifier configurations constructed in accordance with the present invention using mirroring transistors with dissimilar doping profiles;

each of FIGS. 9 and 10 is a partial schematic diagram showing a structural modification suitable for any of the current mirror amplifiers shown in FIGS. 1–8 for providing further embodiments of the present invention;

FIGS. 11 and 12 are schematic diagrams of current mirror amplifiers embodying the present invention;

each of FIGS. 13 and 14 is a schematic diagram, partially in block form, showing a useful feedback connection useful, for example, in conjunction with any of the current mirror amplifiers shown in FIGS. 1–5 for providing further embodiments of the present invention;

each of FIGS. 15–18 is a schematic diagram, partially in block form, showing a cascoded output configuration by which any of the CMA's of FIGS. 1–5 can be connected to provide further embodiments of the present invention;

FIGS. 19, 20 and 21 are schematic diagrams of CMA's embodying the present invention having current gains similar to those of the CMA's in FIGS. 1, 8 and 12, but being of complementary conductivity type; and FIGS. 22, 23 and 24 are plan view and first and second cross-sectional views of an integrated structure providing the current mirror amplifier shown schematically in FIG. 3.

In each of the CMA's of FIGS. 1–8 the input, output, and common terminals are labelled I, O and C, respectively. Terminals B1 and B2 are at the base electrodes of the master and slave transistors, respectively, and are shown joined by direct connection to each other and to the input terminal I. The encircled numbers or algebraic quantities near the emitters of transistors of the same conductivity type are indicative of the relative total areas of their respective base-emitter junctions. The algebraic quantity *m* is associated with the CMA's 10, 20, 30, 40 and 50 of FIGS. 1, 2, 3, 4 and 5, respectively, which are most useful as current attenuators. The algebraic quantity *n* is associated with CMA's 60, 70, 80, 110 and 120 in FIGS. 6, 7, 8, 11 and 12, respectively, which are most useful for obtaining current gains substantially larger than unity. Accordingly, *m* and *n,* which are both positive numbers, preferably are each at least unity-valued.

In CMA 10 of FIG. 1, master transistor Q11 is a super-beta transistor, and slave transistor Q12 is a CPVS transistor. CMA 10 exhibits a current attenuation factor of around 20*m* between its terminals I and O.

In CMA 20 of FIG. 2, master transistor Q21 is a super-beta transistor, and slave transistor Q22 is a sub-beta transistor. CMA 20 exhibits a current attenuation factor of around 1200*m* between its terminals I and O. This, of the simple CMA configurations, offers the greatest current attenuation for given area on the monolithic die.

In CMA 30 of FIG. 3, master transistor Q31 is a super-beta transistor. Slave transistor Q32 is a semi-sub-beta transistor, which may be considered as having parallelled first and second emitter regions, the first emitter region like that of a CPVS transistor and the second emitter region like that of a sub-beta transistor. CMA 30 exhibits a current attenuation factor between its terminals I and O ranging upward from 20*m* to as high as 1200*m.*

In CMA 40 of FIG. 4, master transistor Q41 is a CPVS transistor; slave transistor Q42, a sub-beta transistor. CMA 40 exhibits a current attenuation factor of around 60*m* between its terminals I and O.

In CMA 50 of FIG. 5, master transistor Q51 is a CPVS transistor; slave transistor Q52, a semi-sub-beta transistor. If the total base-emitter junction area of Q52 be equal to that of Q51, CMA 50 exhibits from terminal I to terminal O a current attenuation factor between unity and sixty. When the base-emitter junctions of Q51 and Q52 take up similar areas, keeping the current attenuation factor in the neighborhood of ten or so results in very good scaling accuracy, despite minor mask misregistration during the doping of the monolithic die, as will be explained in detail in connection with FIGS. 22–24. If, in addition, higher current attenuation factors are desired, one may increase the area of the base-emitter junction of Q51 or parallel Q51 with further transistors similar to it and/or use cascade connections of CMA's such as 50, as described further on.

In CMA 60 of FIG. 6, master transistor Q61 is a CPVS transistor; slave transistor Q62, a super-beta transistor. CMA 60 has a current gain of about 20*n* between its I and O terminals.

In CMA 70 of FIG. 7, master transistor Q71 is a semi-sub-beta transistor; slave transistor Q72, a super-beta transistor. CMA 70 can exhibit current gains between its terminals I and O ranging upward from 20*n,* approaching a substantial fraction of the beta of Q72 in the limit case where the master transistor is, in essence, a sub-beta transistor. These higher current gains are less reliably predicted, however, since the base currents of Q71 and Q72 become significant fractions of the input current and cause current gain to exhibit substantial dependence on the transistor beta characteristics. That is, there is increasing departure from ideal current-mirror amplifier operation.

In CMA 80 of FIG. 8, master transistor Q81 is a semi-sub-beta transistor; slave transistor Q82, a CPVS transistor. CMA 80 is useful for obtaining well-defined current gains of five to ten times *n.*

The effects of base current upon the operation of CMA 10, 20, 30, 40, 50, 60, 70 or 80 of the previous FIGURES can be significantly reduced by replacing the direct connection of its terminal I to its joined terminals B1, B2 with an emitter-follower transistor Q9 as shown in FIG. 9 or a source follower transistor Q10 as shown in FIG. 10. Q9 may advantageously be a super-beta transistor if the $+V_{cc}$ operating potential not be too positive respective to the common terminal of the CMA. Other current amplifying arrangements may replace Q9, just as in prior art CMA's. The use of an amplifying arrangement such as Q9 or Q10 also permits configurations such as shown in FIGS. 11 and 12. In FIG. 11, master transistor Q111 is a sub-beta transistor and slave transistor Q112 is a super-beta transistor, giving CMA 110 a current gain close to 1200*n* between its terminals I and O. In FIG. 12, master transistor Q121 is a sub-beta transistor and slave transistor Q122 is a CPVS transistor, giving CMA 120 a current gain close to 60*n* between its terminals I and O.

Generally, it is not feasible to use integrated emitter degeneration resistors with the master and slave mirroring transistors in any of the previously described CMA's to maintain a more predictable proportion between input and output current. This is because the ratio between input and output currents must also be maintained between the emitter degeneration resistors if CMA operation is to be achieved, and maintaining such large ratios requires excessive area on a monolithic integrated circuit. As pointed out above, the base currents of the mirroring transistors are of the same order of magnitude, making it feasible to use properly proportioned base resistors in lieu of emitter degeneration resistors.

One can obtain substantial current gains, without base currents affecting the reliability with which the values of these gains can be predicted, by using CMA 10, 20, 30, 40 or 50 to complete a degenerative current feedback loop around a current amplifier having current gain substantially larger than that sought, thereby obtaining a closed loop gain between a pair of terminals IN and OUT reciprocally related to the current attenuation factor afforded by the CMA. In the FIG. 13 current amplifier network, a Darlington cascade connection of transistors Q131 and Q132 is a high current gain amplifier connected in a degenerative feedback loop with a CMA which may be of any of the types described above and is particularly useful for obtaining current gains larger than unity by using CMA 10, 20, 30, 40 or 50, as shown in FIGS. 1–5 or modifed per FIG. 9 or 10. In the FIG. 14 current amplifier network, a cascade connection of transistors Q141 and Q142 is a high-current gain amplifier included in a direct-coupled degenerative current feedback connection between the output and common terminals of a CMA 10, 20, 30, 40 or 50 as shown in FIGS. 1–5 or modified per FIG. 9 or 10. The direct-coupled cascade connection of transistors Q141 and Q142 includes an avalanche diode D14 for increasing the potential offset between the base electrode of Q142 and terminal O of the CMA, permitting terminal I of the CMA to swing over an increased range without interfering with proper biasing of the CMA.

Figure 15:
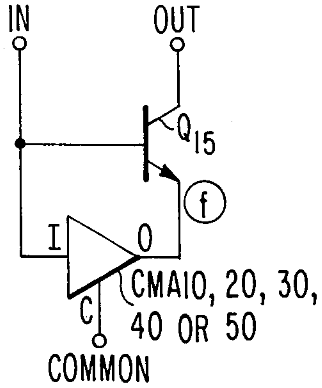
Figure 16:
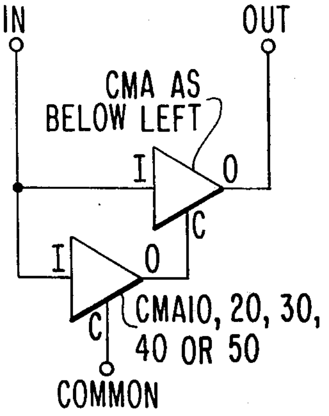
Figure 17:
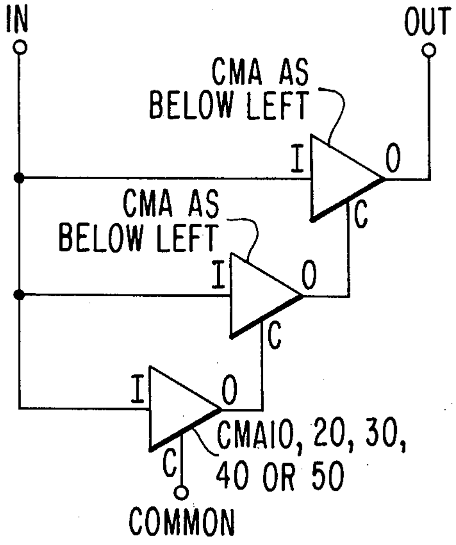

FIG. 15 illustrates how simply a cascode output stage can be arranged for CMA 10, 20, 30, 40 or 50 if the relative area *f* of the base-emitter junction of Q15 is chosen large enough that around 120 millivolts of potential appears between the C and O terminals of the CMA, thereby to avoid saturation of its output transistor. Smaller values of *f* are accomodated by modifying the FIG. 15 apparatus to include a potential-offsetting diode between the base electrode of Q15 and the I terminal of the CMA. With large enough *m*, cascade arrangements of CMA's of any of the types shown in FIGS. 1–5 are possible, as shown in FIGS. 16 and 17. Smaller values of *m* will require inclusion of a potential offsetting diode in the connections between the I terminals of the CMA's.

Figure 18:
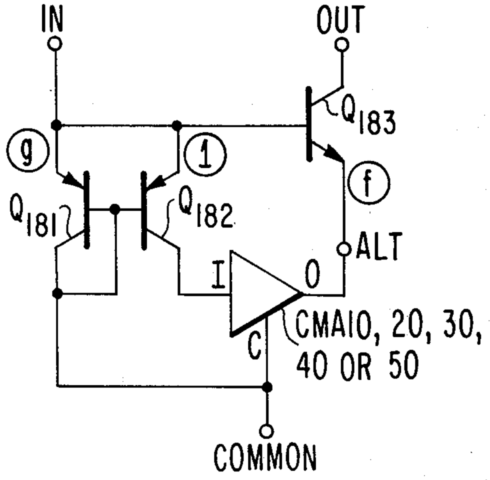

In FIG. 18, complementary conductivity transistors Q181 and Q182, which customarily are constructed as lateral-structure transistors, are connected in a CMA configuration. This CMA functions as a pre-scaler, responding to input current applied to the terminal IN with a current smaller by a factor $(g + 1)$, which is supplied to the I terminal of a further CMA of the type shown in any of FIGS. 1–5. This further CMA responds to demand a still smaller output current which demand is coupled by the common-base amplifier action of transistor Q183 to the terminal OUT. The offset potential across the self-biased transistor suffices to bias the base electrode of Q183, providing *m*, *f* and *g* be sufficiently large in this further CMA. If *m* be smaller, an additional potential-offsetting diode is connected in series with self-biased transistor Q181 for conducting applied input current to develop base bias potential for Q183. Alternatively, output current demand can be presented directly at terminal ALT, dispensing with common-base amplifier transistor Q183. Self-biased transistor Q181 can be replaced by a self-biased CPVS transistor to save some area on a monolithic die without unacceptably compromising current scaling accuracy.

In FIGS. 19, 20 and 21, the teaching of Sheng in Defensive Publication T934,009 has been used to develop CMA's 10′, 80′ and 120′, respectively, similar respectively to CMA's 10, 80 and 120, in current gain but of complementary conductivity type.

The current attenuating configurations shown in FIGS. 1–5 and 15–19 have the feature, often desirable, sometimes required, that the input offset potential between their common and input terminals is only a single junction offset potential. Even where the configurations of FIGS. 15–18 have to be modified to include potential offsetting diodes, these can be made to be Schottky barrier diodes, to maintain the offset potential between common and input terminals less than a volt or so for monolithic silicon construction.

The structure of semi-sub-beta transistors is not well-known in the art and it is desirable to understand why their transconductances can be accurately scaled to those of CPVS transistors. So, further description of the construction of CMA 50 of FIG. 5 appears to be in order. FIG. 22 shows a plan view of the monolithically integrated structures of a first, CPVS transistor Q51 and a second, semi-sub-beta vertical-structure transistor Q52. FIG. 23 shows a cross-sectional view of Q51. FIG. 24 shows a cross-sectional view of Q52.

The structure shown in FIGS. 22, 23 and 24 is constructed as follows. A P-type substrate 10 has an epitaxial layer 11 of N-type material thereupon, separated into isolation tubs 11*a* and 11*b* by subsequent P+ diffusion 12. Isolation tubs 11*a* and 11*b* are the collector regions of Q51 and Q52, respectively, and may have "pockets" or "buried layers" 13*a* and 13*b* of N+ material under them to reduce the collector resistances of these transistors. P regions 14*a* and 14*b* are diffused or implanted into epitaxial layer 11 to serve as base regions for Q51 and Q52, respectively.

Q52 is distinguished from the conventional vertical-structure transistor by a P+ region 15 underlying most of the area under a subsequently diffused or implanted N+ region 16*b* used as the emitter region of Q52. Those portions of the emitter region 16*b* lying over P+ region 15 have an effectiveness, insofar as contributing to the transconductance of Q52, that is smaller per unit area by a substantial factor than the effectiveness of those portions of the emitter region lying over P region 14*b.* This factor is approximately 60 in integrated circuit processing presently used by RCA Corporation. That is, the effective area of the base-emitter junction of Q52 is, in essence, reduced to (*a*) that portion of its area overlying P region 14*b* plus (*b*) that portion of its area overlying P+ region 15 divided by the factor of 60 or so.

The design objective usually is to reduce the effective area of the base-emitter junction of mirroring transistor Q52 by a factor a few times smaller than the factor relating the $h_{fe}$ of a CPVS transistor to the $h_{fe}$ of a sub-beta transistor. If 90% of the emitter region 16*b* overlays P+ region 15, only 10% of the emitter region provides full transconductance/per unit area, giving 10% transconductance compared to Q51, the remainder provides 90% full transconductance/per unit area divided by the factor of sixty giving 1.5% transconductance compared to Q51. Q52 has an overall transconductance about 11.5% of Q51 for such a design. If the ratio between the transconductance per unit area of a base-emitter junction with relatively low base region doping and that of a base-emitter junction with relatively high base region doping, nominally 60, were to range from 50 to 70 over the course of manufacture, the transconductance of Q52 would only range from about 11.8% down to 11.3% of the transconductance of Q51.

The P+ region 15 is usually diffused or implanted into epitaxial layer 11 before diffusion of P regions 14*a* and 14*b*, but may be done afterward. Positioning P+ region 15 diagonally under the site of N+ emitter region 16*b* makes mask mis-registration have less effect upon the area of region 16*b* overlaying P region 14*b*.

After regions 14*a*, 14*b* and 15 are formed N+ regions 16*a*, 16*b*, 16*c*, 16*d* are diffused or implanted. Regions 16*a* and 16*b* provide the emitter regions of Q51 and Q52, respectively; and regions 16*c* and 16*d* provide means for ohmically contacting the collector regions 11*a* and 11*b* of Q51 and Q52, respectively. Except for openings to contact certain regions of Q51 and Q52, a dielectric insulating layer 17 covers the entire surface of the integrated circuit die described above. Openings 17*a*, 17*b*, 17*c*, 17*d*, 17*e* and 17*f* permit access to the following regions, respectively: base of Q51, emitter of Q51, collector of Q51, base of Q52, emitter of Q52 and collector of Q52.

Metallization such as aluminum is used to ohmically contact and to interconnect certain of the transistor regions to arrange Q51 and Q52 as CMA 50. An "ohmic contact" is a non-rectifying contact such as between aluminum and P or N+ silicon. Metallization 18 provides the input connection of CMA 50 ohmically contacting and interconnecting the collector region of Q51 and the base regions of Q51 and Q52. Metallization 19 provides the common connection of CMA 50 ohmically contacting and interconnecting the emitter regions of Q51 and Q52. Metallization 20 provides the output connection of CMA 50, ohmically contacting the collector region of Q52.

CMA's can be constructed using two semi-sub-beta mirroring transistors, the first more like a conventional process vertical-structure transistor than the second and the second more like a sub-beta transistor than the first. Such CMA's are also considered to embody the present invention.

What is claimed is:

1. A current mirror amplifier having input and output and common terminals, having first and second mirroring transistors and exhibiting an inverting current gain between its input and output terminals equal to the transconductance of its second mirroring transistor divided by the transconductance of its first mirroring transistor, the collector-to-emitter paths of one of said first and said second transistors being included in the input circuit of said current mirror amplifier between its input and common terminals and the other being included in the output circuit of said current mirror amplifier between its output and common terminals, said first transistor having a base region and an emitter region and having a base-emitter junction of area $A_1$ between its base and emitter regions, said second transistor having a base region and an emitter region and having a base-emitter junction of area $A_2$ between its base and emitter regions, one of said first and said second transistors having a portion of its base region adjacent to its emitter region doped more heavily than the rest of its base region and the base region of the other of said first and said second transistors, thereby to cause said inverting current gain to differ substantially from $A_2/A_1$.

2. A plurality of current mirror amplifiers as set forth in claim 1 having their input terminals connected together and their output circuits connected in series with each other.

3. A current mirror amplifier comprising:

input, output and common terminals;

first and second transistors of a first conductivity type, each having base and emitter and collector electrodes, said first transistor being a superbeta type and said second transistor being a conventional process vertical-structure type, the emitter electrodes of said first and said second transistors being connected to said common terminal;

first galvanic connection means between the collector electrode of said first transistor and said input terminal;

second galvanic connection means between the collector electrode of said second transistor and said output terminal; and a direct-coupled feedback connection between the collector electrode of said first transistor and an interconnection between the base electrodes of said first and said second transistors.

4. A current mirror amplifier as set forth in claim 3 wherein said direct-coupled feedback connection between the collector electrode of said first transistor and an interconnection between the base electrodes of said first and said second transistors consists of a direct connection.

5. A current mirror amplifier as set forth in claim 4 including:

a third transistor of said first conductivity type having a base electrode connected to said input terminal, having an emitter electrode connected to the collector electrode of said second transistor, having a collector electrode connected to said output terminal, and comprising said second galvanic connection between its emitter and collector electrodes.

6. A current mirror amplifier as set forth in claim 5 included in a current attenuator, said current attenuator comprising:

a fourth transistor of a second conductivity type complementary to said first conductivity type, said fourth transistor having base and emitter electrodes with a baseemitter junction therebetween and having a collector electrode connected to the input terminal of said current mirror amplifier;

a fifth self-biased transistor connected in parallel with the base-emitter junction of said fourth transistor;

an input terminal to which the emitter electrode of said fourth transistor is directly connected;

an output terminal to which the output terminal of said current mirror amplifier is connected; and a common terminal to which the base electrode of said fourth transistor and the common terminal of said current mirror amplfier are connected.

7. A plurality of current mirror amplifiers as set forth in claim 4 combined to form a current attenuator, said current attenuator having an input terminal to which the input terminals of each of said plurality of current mirror amplifiers is directly connected, said current attenuator having a common terminal to which the common terminal of the first of said current mirror amplifiers is connected, said current attenuator having an output terminal to which the output terminal of the last of said plurality of said current mirror amplifiers is connected, and said current attenuator having a connection of the output terminal of each of said plurality of current mirror amplifiers save the last connected to the common terminal of the succeeding one of said plurality of current mirror amplifiers.

8. A current mirror amplifier as set forth in claim 4 included in a current attenuator, said current attenuator comprising:

a third transistor of a second conductivity type complementary to said first conductivity type, said third transistor having base and emitter electrodes with a baseemitter junction therebetween and having a collector electrode connected to the input terminal of said current mirror amplifier;

a fourth self-biased transistor connected in parallel with the base-emitter junction of said third transistor;

an input terminal to which the emitter electrode of said third transistor is directly connected;

an output terminal to which the output terminal of said current mirror amplifier is connected; and a common terminal to which the base electrode of said third transistor and the common terminal of said current mirror amplifier are connected.

9. A current mirror amplifier as set forth in claim 3 connected in current feedback loop with:

another current amplifier having input, output and common terminals and exhibiting a current gain between its input and output terminals which is substantially higher than the reciprocal of the current gain of said current mirror amplifier, the input and output terminals of said current mirror amplifier respectively connected to the common terminal of said other current amplifier and to its input terminal for stabilizing the current gain between the input and output terminals of said other current amplifier to be substantially equal to the reciprocal of the current gain of said current mirror amplifier.

10. A current mirror amplifier as set forth in claim 3 in combination with:

another current amplifier having input, output and common terminals and exhibiting a current gain between its input and output terminals which is substantially higher than the reciprocal of the current gain of said current mirror amplifier, the input and output terminals of said other current amplifier respectively connected to the output terminal of said current mirror amplifier and to its common terminal for stabilizing the current gain between the input terminals of said other current amplifier and said current mirror amplifier to be substantially equal to the reciprocal of the current gain of said current mirror amplifier.

11. A current mirror amplifier as set forth in claim 4 wherein said direct-coupled feedback connection between the collector electrode of said first transistor and an interconnection between the base electrodes of said first and said second transistors is provided by the emitter follower action of a third, bipolar transistor of said first conductivity type.

12. A current mirror amplifier as set forth in claim 3 wherein said direct-coupled feedback connection between the collector electrode of said first transistor and an interconnection between the base electrodes of said first and said second transistors is provided by the source follower action of a third, field effect transistor of a conductivity type similar to said first conductivity type.

13. A current mirror amplifier comprising:

input, output and common terminals;

first and second transistors of a first conductivity type, each having base and emitter and collector electrodes, said first transistor being a super-beta type and said second transistor being a semi-sub-beta type, the emitter electrodes of said first and said second transistors being connected to said common terminal;

first galvanic connection means between the collector electrode of said first transistor and said input terminal;

second galvanic connection means between the collector electrode of said second transistor and said output terminal; and a direct-coupled feedback connection between the collector electrode of said first transistor and an interconnection between the base electrodes of said first and said second transistors.

14. A current mirror amplifier as set forth in claim 13 wherein said direct-coupled feedback connection between the collector electrode of said first transistor and an interconnection between the base electrodes of said first and said second transistors consists of a direct connection.

15. A current mirror amplifier as set forth in claim 14 including:

a third transistor of said first conductivity type having a base electrode connected to said input terminal, having an emitter electrode connected to the collector electrode of said second transistor, having a collector electrode connected to said output terminal, and comprising said second galvanic connection between its emitter and collector electrodes.

16. A current mirror amplifier as set forth in claim 15 included in a current attenuator, said current attenuator comprising:

a fourth transistor of a second conductivity type complementary to said first conductivity type, said fourth transistor having base and emitter electrodes with a baseemitter junction therebetween and having a collector electrode connected to the input terminal of said current mirror amplifier;

a fifth self-biased transistor connected in parallel with the base-emitter junction of said fourth transistor;

an input terminal to which the emitter electrode of said fourth transistor is directly connected;

an output terminal to which the output terminal of said current mirror amplifier is connected; and a common terminal to which the base electrode of said fourth transistor and the common terminal of said current mirror amplifier are connected.

17. A plurality of current mirror amplifiers as set forth in claim 13 combined to form a current attenuator, said current attenuator having an input terminal to which the input terminals of each of said plurality of current mirror amplifiers is directly connected, said current attenuator having a common terminal to which the common terminal of the first of said current mirror amplifiers is connected, said current attenuator having an output terminal to which the output terminal of the last of said plurality of said current mirror amplifiers is connected, and said current attenuator having a connection of the output terminal of each of said plurality of current mirror amplifiers save the last connected to the common terminal of the succeeding one of said plurality of current mirror amplifiers.

18. A current mirror amplifier as set forth in Claim 14 included in a current attenuator, said current attenuator comprising:

a third transistor of a second conductivity type complementary to said first conductivity type, said third transistor having base and emitter electrodes with a baseemitter junction therebetween and having a collector electrode connected to the input terminal of said current mirror amplifier;

a fourth self-biased transistor connected in parallel with the base-emitter junction of said fourth transistor;

an input terminal to which the emitter electrode of said third transistor is directly connected;

an output terminal to which the output terminal of said current mirror amplifier is connected; and a common terminal to which the base electrode of said third transistor and the common terminal of said current mirror amplifier are connected.

19. A current mirror amplifier as set forth in claim 13 connected in current feedback loop with:

another current amplifier having input, output and common terminals and exhibiting a current gain between its input and output terminals which is substantially higher than the reciprocal of the current gain of said current mirror amplifier, the input and output terminals of said current mirror amplifier respectively connected to the common terminal of said other current amplifier and to its input terminal for stabilizing the current gain between the input and output terminals of said other current amplifier to be substantially equal to the reciprocal of the current gain of said current mirror amplifier.

20. A current mirror amplifier as set forth in claim 13 in combination with:

another current amplifier having input, output and common terminals and exhibiting a current gain between its input and output terminals which is substantially higher than the reciprocal of the current gain of said current mirror amplifier, the input and output terminals of said other current amplifier respectively connected to the output terminal of said current mirror amplifier and to its common terminal for stabilizing the current gain between the input terminals of said other current amplifier and said current mirror amplifier to be substantially equal to the reciprocal of the current gain of said current mirror amplifier.

21. A current mirror amplifier as set forth in claim 13 wherein said direct-coupled feedback connection between the collector electrode of said first transistor and an interconnection between the base electrodes of said first and said second transistors is provided by the emitter follower action of a third, bipolar transistor of said first conductivity type.

22. A current mirror amplifier as set forth in claim 13 wherein said direct-coupled feedback connection between the collector electrode of said first transistor and an interconnection between the base electrodes of said first and said second transistors is provided by the source follower action of a third, field effect transistor of a conductivity type similar to said first conductivity type.

23. A current mirror amplifier comprising:

input, output and common terminals;

first and second transistors of a first conductivity type, each having base and emitter and collector electrodes, said first transistor being a super-beta type and said second transistor being a sub-beta type, the emitter electrodes of said first and said second transistors being connected to said common terminal;

first galvanic connection means between the collector electrode of said first transistor and said input terminal;

second galvanic connection means between the collector electrode of said second transistor and said output terminal; and a direct-coupled feedback connection between the collector electrode of said first transistor and an interconnection between the base electrodes of said first and said second transistors.

24. A current mirror amplifier as set forth in claim 23 wherein said direct-coupled feedback connection between the collector electrode of said first transistor and an interconnection between the base electrodes of said first and said second transistors consists of a direct connection.

25. A current mirror amplifier as set forth in claim 24 including:

a third transistor of said first conductivity type having a base electrode connected to said input terminal, having an emitter electrode connected to the collector electrode of said second transistor, having a collector electrode connected to said output terminal, and comprising said second galvanic connection between its emitter and collector electrodes.

26. A current mirror amplifier as set forth in claim 25 included in a current attenuator, said current attenuator comprising:

a fourth transistor of a second conductivity type complementary to said first conductivity type, said fourth transistor having base and emitter electrodes with a base-emitter junction therebetween and having a collector electrode connected to the input terminal of said current mirror amplifier;

a fifth self-biased transistor connected in parallel with the base-emitter junction of said fourth transistor;

an input terminal to which the emitter electrode of said fourth transistor is directly connected;

an output terminal to which the output terminal of said current mirror amplifier is connected; and a common terminal to which the base electrode of said fourth transistor and the common terminal of said current mirror amplifier are connected.

27. A plurality of current mirror amplifiers as set forth in claim 23 combined to form a current attenuator, said current attenuator having an input terminal to which the input terminals of each of said plurality of current mirror amplifiers is directly connected, said current attenuator having a common terminal to which the common terminal of the first of said current mirror amplifiers is connected, said current attenuator having an output terminal to which the output terminal of the last of said plurality of said current mirror amplifiers is connected, and said current attenuator having a connection of the output terminal of each of said plurality of current mirror amplifiers save the last connected to the common terminal of the succeeding one of said plurality of current mirror amplifiers.

28. A current mirror amplifier as set forth in claim 24 included in a current attenuator, said current attenuator comprising:

a third transistor of a second conductivity type complementary to said first conductivity type, said third transistor having base and emitter electrodes with a base-emitter junction therebetween and having a collector electrode connected to the input terminal of said current mirror amplifier;

a fourth self-biased transistor connected in parallel with the base-emitter junction of said fourth transistor;

an input terminal to which the emitter electrode of said third transistor is directly connected;

an output terminal to which the output terminal of said current mirror amplifier is connected; and a common terminal to which the base electrode of said third transistor and the common terminal of said current mirror amplifier are connected.

29. A current mirror amplifier as set forth in claim 23 connected in current feedback loop with:

another current amplifier having input, output and common terminals and exhibiting a current gain between its input and output terminals which is substantially higher than the reciprocal of the current gain of said current mirror amplifier, the input and output terminals of said current mirror amplifier respectively connected to the common terminal of said other current amplifier and to its input terminal for stabilizing the current gain between the input and output terminals of said other current amplifier to be substantially equal to the reciprical of the current gain of said current mirror amplifier.

30. A current mirror amplifier as set forth in claim 23 in combination with:

another current amplifier having input, output and common terminals and exhibiting a current gain between its input and output terminals which is substantially higher than the reciprocal of the current gain of said current mirror amplifier, the input and output terminals of said other current amplifier respectively connected to the output terminal of said current mirror amplifier and to its common terminal for stabilizing the current gain between the input terminals of said other current amplifier and said current mirror amplifier to be substantially equal to the reciprocal of the current gain of said current mirror amplifier.

31. A current mirror amplifier as set forth in claim 23 wherein said direct-coupled feedback connection between the collector electrode of said first transistor and an interconnection between the base electrodes of said first and said second transistors is provided by the emitter follower action of a third, bipolar transistor of said first conductivity type.

32. A current mirror amplifier as set forth in claim 23 wherein said direct-coupled feedback connection between the collector electrode of said first transistor and an interconnection between the base electrodes of said first and said second transistors is provided by the source follower action of a third, field effect transistor of a conductivity type similar to said first conductivity type.

33. A current mirror amplifier comprising:

input, output and common terminals;

first and second transistors of a first conductivity type, each having base and emitter and collector electrodes, said first transistor being a conventional-process vertical-structure type and said second transistor being a sub-beta type, the emitter electrodes of said first and said second transistors being connected to said common terminal;

first galvanic connection means between the collector electrode of said first transistor and said input terminal;

second galvanic connection means between the collector electrode of said second transistor and said output terminal; and a direct-coupled feedback connection between the collector electrode of said first transistor and an interconnection between the base electrodes of said first and said second transistors.

34. A current mirror amplifier as set forth in claim 33, wherein said direct-coupled feedback connection between the collector electrode of said first transistor and an interconnection between the base electrodes of said first and said second transistors consists of a direct connection.

35. A current mirror amplifier as set forth in claim 34 including:

a third transistor of said first conductivity type having a base electrode connected to said input terminal, having an emitter electrode connected to the collector electrode of said second transistor, having a collector electrode connected to said output terminal, and comprising said second galvanic connection between its emitter and collector electrodes.

36. A current mirror amplifier as set forth in claim 35 included in a current attenuator, said current attenuator comprising:

a fourth transistor of a second conductivity type complementary to said first conductivity type, said fourth transistor having base and emitter electrodes with a base-emitter junction therebetween and having a collector electrode connected to the input terminal of said current mirror amplifier;

a fifth self-biased transistor connected in parallel with the base-emitter junction of said fourth transistor;

an input terminal to which the emitter electrode of said fourth transistor is directly connected;

an output terminal to which the output terminal of said current mirror amplifier is connected; and a common terminal to which the base electrode of said fourth transistor and the common terminal of said current mirror amplifier are connected.

37. A plurality of current mirror amplifiers as set forth in claim 34 combined to form a current attenuator, said current attenuator having an input terminal to which the input terminals of each of said plurality of current mirror amplifiers is directly connected, said current attenuator having a common terminal to which the common terminal of the first of said current mirror amplifiers is connected, said current attenuator having an output terminal to which the output terminal of the last of said plurality of said current mirror amplifiers is connected, and said current attenuator having a connection of the output terminal of each of said plurality of current mirror amplifiers save the last connected to the common terminal of the succeeding one of said plurality of current mirror amplifiers.

38. A current mirror amplifier as set forth in claim 34 included in a current attenuator, said current attenuator comprising:

a third transistor of a second conductivity type complementary to said first conductivity type, said third transistor having base and emitter electrodes with a base-emitter junction therebetween and having a collector electrode connected to the input terminal of said current mirror amplifier;

a fourth self-biased transistor connected in parallel with the base-emitter junction of said fourth transistor;

an input terminal to which the emitter electrode of said third transistor is directly connected;

an output terminal to which the output terminal of said current mirror amplifier is connected; and a common terminal to which the base electrode of said third transistor and the common terminal of said current mirror amplifier are connected.

39. A current mirror amplifier as set forth in claim 33 connected in current feedback loop with:

another current amplifier having input, output and common terminals and exhibiting a current gain between its input and output terminals which is substantially higher than the reciprocal of the current gain of said current mirror amplifier, the input and output terminals of said current mirror amplifier respectively connected to the common terminal of said other current amplifier and to its input terminal for stabilizing the current gain between the input and output terminals of said other current amplifier to be substantially equal to the reciprocal of the current gain of said current mirror amplifier.

40. A current mirror amplifier as set forth in claim 33 in combination with:

another current amplifier having input, output and common terminals and exhibiting a current gain between its input and output terminals which is substantially higher than the reciprocal of the current gain of said current mirror amplifier, the input and output terminals of said other current amplifier respectively connected to the output terminal of said current mirror amplifier and to its common terminal for stabilizing the current gain between the input terminals of said other current amplifier and said current mirror amplifier to be substantially equal to the reciprocal of the current gain of said current mirror amplifier.

41. A current mirror amplifier as set forth in claim 33 wherein said direct-coupled feedback connection between the collector electrode of said first transistor and an interconnection between the base electrodes of said first and said second transistors is provided by the emitter follower action of a third, bipolar transistor of said first conductivity type.

42. A current mirror amplifier as set forth in claim 33 wherein said direct-coupled feedback connection between the collector electrode of said first transistor and an interconnection between the base electrodes of said first and said second transistors is provided by the source follower action of a third, field effect transistor of a conductivity type similar to said first conductivity type.

43. A current mirror amplifier comprising:

input, output and common terminals;

first and second transistors of a first conductivity type, each having base and emitter and collector electrodes, said first transistor being a conventional-process vertical-structure type and said second transistor being a semi-sub-beta type, the emitter electrodes of said first and said second transistors being connected to said common terminal;

first galvanic connection means between the collector electrode of said first transistor and said input terminal;

second galvanic connection means between the collector electrode of said second transistor and said output terminal; and a direct-coupled feedback connection between the collector electrode of said first transistor and an interconnection between the base electrodes of said first and said second transistors.

44. A current mirror amplifier as set forth in claim 43 wherein said direct-coupled feedback connection between the collector electrode of said first transistor and an interconnection between the base electrodes of said first and said second transistors consists of a direct connection.

45. A current mirror amplifier as set forth in claim 44 including:

a third transistor of said first conductivity type having a base electrode connected to said input terminal, having an emitter electrode connected to the collector electrode of said second transistor, having a collector electrode connected to said output terminal, and comprising said second galvanic connection between its emitter and collector electrodes.

46. A current mirror amplifier as set forth in claim 45 included in a current attenuator, said current attenuator comprising:

a fourth transistor of a second conductivity type complementary to said first conductivity type, said fourth transistor having base and emitter electrodes with a base emitter junction therebetween and having a collector electrode connected to the input terminal of said current mirror amplifier;

a fifth self-biased transistor connected in parallel with the base-emitter junction of said fourth transistor;

an input terminal to which the emitter electrode of said fourth transistor is directly connected;

an output terminal to which the output terminal of said current mirror amplifier, is connected; and a common terminal to which the base electrodes of said fourth transistor and the common terminal of said current mirror amplifier are connected.

47. A plurality of current mirror amplifiers as set forth in claim 44 combined to form a current attenuator, said current attenuator having an input terminal to which the input terminals of each of said plurality of current mirror amplifiers is directly connected, said current attenuator having a common terminal to which the common terminal of the first of said current mirror amplifiers is connected, said current attenuator having an output terminal to which the output terminal of the last of said plurality of said current mirror amplifiers is connected, and said current attenuator having a connection of the output terminal of each of said plurality of current mirror amplifiers save the last connected to the common terminal of the succeeding one of said plurality of current mirror amplifiers.

48. A current mirror amplifier as set fourth in claim 44 included in a current attenuator, said current attenuator comprising:

a third transistor of a second conductivity type complementary to said first conductivity type, said third transistor having base and emitter electrodes with a base emitter junction therebetween and having a collector electrode connected to the input terminal of said current mirror amplifier;

a fourth self-biased transistor connected in parallel with the base-emitter junction of said fourth transistor;

an input terminal to which the emitter electrode of said third transistor is directly connected;

an output terminal to which the output terminal of said current mirror amplifier is connected; and a common terminal to which the base electrode of said third transistor and the common terminal of said current mirror amplifier are connected.

49. A current mirror amplifier as set forth in claim 43 connected in current feedback loop with:

another current amplifier having input, output and common terminals and exhibiting a current gain between its input and output terminals which is substantially higher than the reciprocal of the current gain of said current mirror amplifier, the input and output terminals of said current mirror amplifier respectively connected to the common terminal of said other current amplifier and to its input terminal for stabilizing the current gain between the input and output terminals of said other current amplifier to be substantially equal to the reciprocal of the current gain of said current mirror amplifier.

50. A current mirror amplifier as set forth in claim 43 in combination with:

another current amplifier having input, output and common terminals and exhibiting a current gain between its input and output terminals which is substantially higher than the reciprocal of the current gain of said current mirror amplifier, the input and output terminals of said other current amplifier respectively connected to the output terminal of said current mirror amplifier and to its common terminal for stabilizing the current gain between the input terminals of said other current amplifier and said current mirror amplifier to be substantially equal to the reciprocal of the current gain of said current mirror amplifier.

51. A current mirror amplifier as set forth in claim 43 wherein said direct-coupled feedback connection between the collector electrode of said first transistor and an interconnection between the base electrodes of said first and said second transistors is provided by the emitter follower action of a third, bipolar transistor of said first conductivity type.

52. A current mirror amplifier as set forth in claim 43 wherein said direct-coupled feedback connection between the collector electrode of said first transistor and an interconnection between the base electrodes of said first and said second transistors is provided by the source follower action of a third, field effect transistor of a conductivity type similar to said first conductivity type..

53. A current mirror amplifier comprising:

input, output and common terminals;

first and second transistors of a first conductivity type, each having base and emitter and collector electrodes, said first transistor being a conventional-process vertical-structure type and said second transistor being a super-beta type, the emitter electrodes of said first and said second transistors being connected to said common terminal;

first galvanic connection means between the collector electrode of said first transistor and said input terminal;

second galvanic connection means between the collector electrode of said second transistor and said output terminal; and a direct-coupled feedback connection between the collector electrode of said first transistor and an interconnection between the base electrodes of said first and said second transistors.

54. A current mirror amplifier as set forth in claim 53 wherein said direct-coupled feedback connection between the collector electrode of said first transistor and an interconnection between the base electrodes of said first and said second transistors consists of a direct connection.

55. A current mirror amplifier as set forth in claim 53 wherein said direct-coupled feedback connection between the collector electrode of said first transistor and an interconnection between the base electrodes of said first and said second transistors is provided by the emitter follower action of a third, bipolar transistor of said first conductivity type.

56. A current mirror amplifier as set forth in claim 53 wherein said direct-coupled feedback connection between the collector electrode of said first transistor and an interconnection between the base electrodes of said first and said second transistors is provided by the source follower action of a third, field effect transistor of a conductivity type similar to said first conductivity type.

57. A current mirror amplifier comprising:

input, output and common terminals;

first and second transistors of a first conductivity type, each having base and emitter and collector electrodes, said first transistor being a semi-sub-beta type and said second transistor being a super-beta type, the emitter electrodes of said first and said second transistors being connected to said common terminal;

first galvanic connection means between the collector electrode of said first transistor and said input terminal;

second galvanic connection means between the collector electrode of said second transistor and said output terminal; and a direct-coupled feedback connection between the collector electrode of said first transistor and an interconnection between the base electrodes of said first and said second transistors.

58. A current mirror amplifier as set forth in claim 57 wherein said direct-coupled feedback connection between the collector electrode of said first transistor and an interconnection between the base electrodes of said first and said second transistors consists of a direct connection.

59. A current mirror amplifier as set forth in claim 59 wherein said direct-coupled feedback connection between the collector electrode of said first transistor and an interconnection between the base electrodes of said first and said second transistors is provided by the emitter follower action of a third, bipolar transistor of said first conductivity type.

60. A current mirror amplifier as set forth in claim 57 wherein said direct-coupled feedback connection between the collector electrode of said first transistor and an interconnection between the base electrodes of said first and said second transistors is provided by the source follower action of a third, field effect transistor of a conductivity type similar to said first conductivity type.

61. A current mirror amplifier comprising:

input, output and common terminals;

first and second transistors of a first conductivity type, each having base and emitter and collector electrodes, said first transistor being a semi-sub-beta type and said second transistor being a conventional-process vertical-structure type, the emitter electrodes of said first and said second transistors being connected to said common terminal;

first galvanic connection means between the collector electrode of said first transistor and said input terminal;

second galvanic connection means between the collector electrode of said second transistor and said output terminal; and a direct-coupled feedback connection between the collector electrode of said first transistor and an interconnection between the base electrodes of said first and said second transistors.

62. A current mirror amplifier as set forth in claim 61 wherein said direct coupled feedback connection between the collector electrode of said first transistor and an interconnection between the base electrodes of said first and said second transistors consists of a direct connection.

63. A current mirror amplifier as set forth in claim 61 wherein said direct-coupled feedback connection between the collector electrode of said first transistor and an interconnection between the base electrodes of said first and said second transistors is provided by the emitter follower action of a third, bipolar transistor of said first conductivity type.

64. A current mirror amplifier as set forth in claim 61 wherein said direct-coupled feedback connection between the collector electrode of said first transistor and an interconnection between the base electrodes of said first and said second transistors is provided by the source follower action of a third, field effect transistor of a conductivity type similar to said first conductivity type.

65. A current mirror amplifier comprising:

input, output and common terminals;

first and second and third transistors of a first conductivity type, each having base and emitter and collector electrodes, said first transistor being a sub-beta type, said second transistor being a conventional-process vertical-structure type, the emitter electrodes of said first and said second transistors being connected to said common terminal;

means for connecting said third transistor as a potential follower between said input terminal and an interconnection between the base electrodes of said first and said second transistors;

first galvanically conductive means between the collector electrode of said first transistor and said input terminal; and second galvanically conductive means between the collector electrode of said second transistor and said input terminal.

66. A current mirror amplifier comprising:

input, output and common terminals;

first and second and third transistors of a first conductivity type, each having base and emitter and collector electrodes, said first transistor being a sub-beta type, said second transistor being a super-beta type, the emitter electrodes of said first and said second transistors being connected to said common terminal;

means for connecting said third transistor as a potential follower between said input terminal and an interconnection between the base electrodes of said first and said second transistors;

first galvanically conductive means between the collector electrode of said first transistor and said input terminal; and second galvanically conductive means between the collector electrode of said second transistor and said input terminal.

67. A current mirror amplifier comprising:

an input terminal;

an output terminal;

a common terminal; and first and second transistors of complementary conductivity types, each having base and emitter and collector electrodes, said first transistor being a super-beta type and said second transistor being a lateral structure type, the emitter electrode of said first transistor and the base electrode of said second transistor being connected to said input terminal, the collector electrode of said second transistor being connected to said output terminal, and the base and collector electrodes of said first transistor and the emitter electrode of said second transistor being connected to said common terminal.

68. A current mirror amplifier comprising:

an input terminal;

an output terminal;

a common terminal; and first and second transistors of complementary conductivity types, each having base and emitter and collector electrodes, said first transistor being a semi-sub beta type and said second transistor being a lateral type, the emitter electrode of said first transistor and the base electrode of said second transistor being connected to said input terminal, the collector electrode of said second transistor being connected to said output terminal, and the base and collector electrode of said first transistor and the emitter electrode of said second transistor being connected to said common terminal.

69. A current mirror amplifier comprising:

an input terminal;

an output terminal;

a common terminal; and first and second transistors of complementary conductivity types, each having base and emitter and collector electrodes, said first transistor being a sub-beta type and said second transistor being a lateral type, the emitter electrode of said first transistor and the base electrode of said second transistor being connected to said input terminal, the collector electrode of said second transistor being connected to said output terminal, and the base and collector electrodes of said first transistor and the emitter electrode of said second transistor being connected to said common terminal.

* * * * *

UNITED STATES PATENT OFFICE

CERTIFICATE OF CORRECTION

PATENT NO. : 4,057,763

DATED : November 8, 1977

INVENTOR(S) : Carl Franklin Wheatley, Jr.

It is certified that error appears in the above-identified patent and that said Letters Patent are hereby corrected as shown below:

Col 1, line 54, "Pat. No." should be --Pat. Nos.--.
Col 8, line 45, "baseemitter" should be --base-emitter--;
" line 58, "claim 4" should be --claim 3--.
Col 9, line 10, "baseemitter" should be --base-emitter--;
" line 52, "claim 4" should be --claim 3--.
Col 10, line 39, "baseemitter" should be --base-emitter--.
Col 11, line 4, "baseemitter" should be --base-emitter--.
Col 14, line 43, "claim 34" should be --claim 33--.
Col 16, line 38, "claim 44" should be --claim 43--.
Col 18, line 45, "claim 59" should be --claim 57--.

Signed and Sealed this

*Thirteenth* Day of *June 1978*

[SEAL]

*Attest:*

RUTH C. MASON
*Attesting Officer*

DONALD W. BANNER
*Commissioner of Patents and Trademarks*